United States Patent

Bley et al.

[11] Patent Number: 5,162,078
[45] Date of Patent: Nov. 10, 1992

[54] METHOD OF PRODUCING MICROSTRUCTERED METALLIC BODIES

[75] Inventors: Peter Bley, Eggenstein-Leopoldshafen; Herbert Hein, Karlsruhe; Jürgen Mohr, Sulzfeld; Werner Schomburg, Karlsruhe, all of Fed. Rep. of Germany

[73] Assignee: Kernforschungszentrum Karlsruhe GmbH, Karlsruhe, Fed. Rep. of Germany

[21] Appl. No.: 721,435
[22] PCT Filed: Nov. 7, 1990
[86] PCT No.: PCT/DE90/00841
    § 371 Date: Jul. 5, 1991
    § 102(e) Date: Jul. 5, 1991
[87] PCT Pub. No.: WO91/07700
    PCT Pub. Date: May 30, 1991

[30] Foreign Application Priority Data

Nov. 9, 1989 [DE] Fed. Rep. of Germany ....... 3937308

[51] Int. Cl.$^5$ .................................................. C25D 1/08
[52] U.S. Cl. ........................................................ 205/75
[58] Field of Search ............................................ 294/11

[56] References Cited

U.S. PATENT DOCUMENTS

| 4,288,283 | 9/1981 | Umezaki et al. ............... 156/643 |
| 4,347,264 | 8/1982 | Lindmayer ...................... 430/314 |
| 4,541,977 | 9/1985 | Becker et al. ................... 264/102 |
| 4,657,844 | 4/1987 | Shu et al. ........................ 430/325 |
| 4,988,413 | 1/1991 | Chakravorty .................... 204/15 |

FOREIGN PATENT DOCUMENTS

| 0082977 | 7/1983 | European Pat. Off. |
| 0091651 | 10/1983 | European Pat. Off. |
| 3000746 | 8/1980 | Fed. Rep. of Germany |
| 3335171 | 4/1985 | Fed. Rep. of Germany |
| 3712268 | 8/1988 | Fed. Rep. of Germany |
| 8402986 | 8/1984 | PCT Int'l Appl. |

Primary Examiner—T. M. Tufariello
Attorney, Agent, or Firm—Spencer, Frank & Schneider

[57] ABSTRACT

The invention relates to a method of producing microstructured metallic bodies in which plastic negative molds of the microstructures are produced on an electrically conductive base plate by means of electron beam lithography, X-ray lithography or a micromolding technique. Cavities of the negative molds are filled with metal by electroplating while employing the electrically conductive base plate as an electrode. In the course of producing the negative molds, a residual plastic layer is left at the bottom of the cavities of the negative molds on the electrically conductive base plate. Also, before the cavities of the negative molds are filled with metal by electroplating, the residual plastic layer at the bottom of the cavities is removed by means of reactive ion etching with ions that are accelerated perpendicularly toward the surface of the base plate.

9 Claims, 1 Drawing Sheet

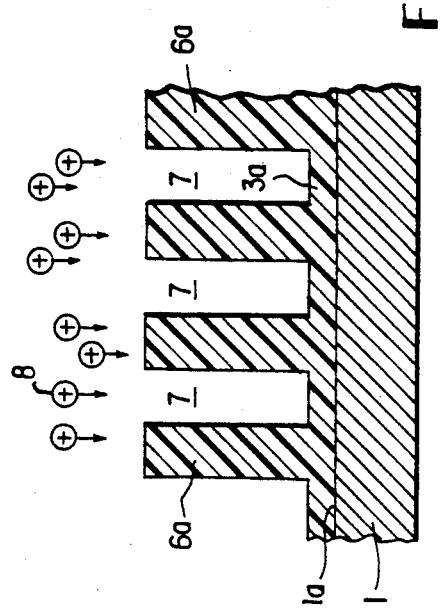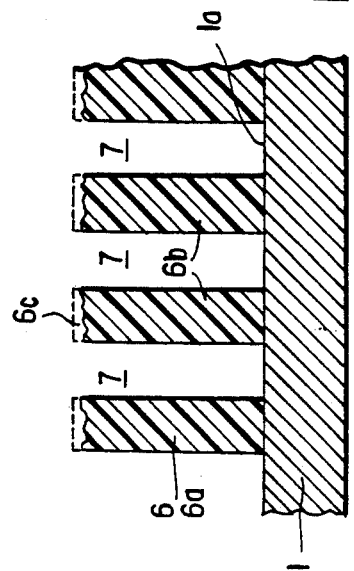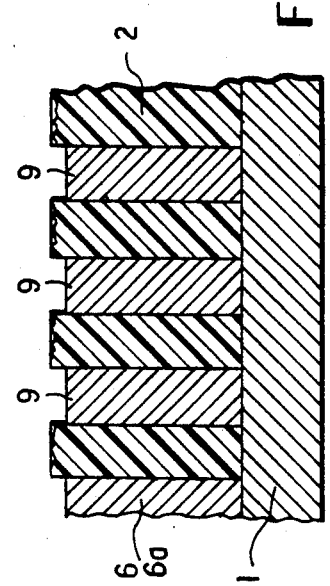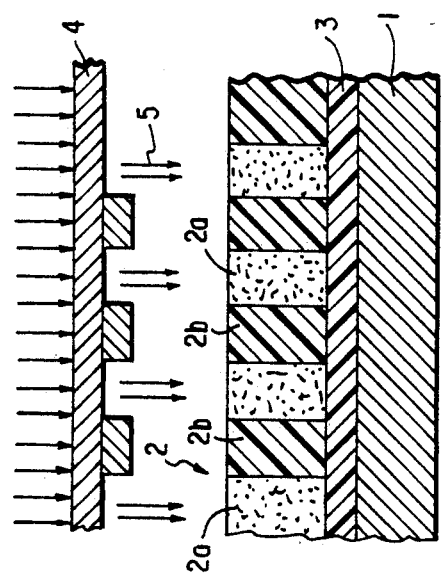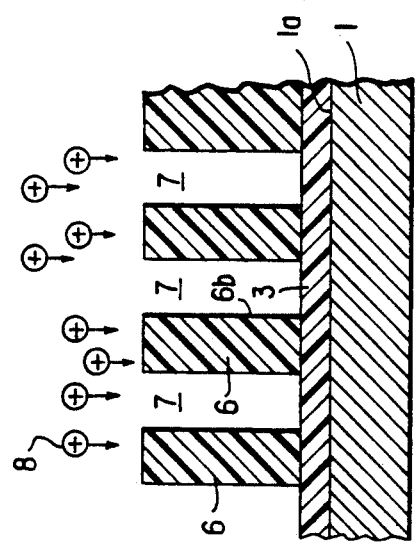

METHOD OF PRODUCING MICROSTRUCTERED METALLIC BODIES

BACKGROUND OF THE INVENTION

1. Field of the Invention

The invention relates to a method of producing microstructured metallic bodies on an electrically conductive base plate by one of electron beam lithography, X-ray lithography and micromolding wherein cavities of negative molds are filled with metal.

2. Description of the Related Art

Methods of this type are disclosed in German Patent Nos. 3,712,268 and 3,206,820. According to German Patent No. 3,712,268, a resist layer sensitive to X-ray radiation is applied onto a metallic carrier layer, e.g. of chromium nickel steel, and is partially exposed to synchrotron radiation through an X-ray mask. The exposed regions are dissolved out with a liquid developer, thus creating cavities corresponding to the microstructures which are filled by electroplating with a metal, employing the metallic carrier layer as an electrode. Thereafter, the remaining resist layer and, depending on the intended use for the microstructured body, also the carrier layer can be removed. With these X-ray deep-etch lithography electroforming processes, also abbreviated as the LIGA process, microstructures can be generated which have a very high aspect ratio and smallest lateral dimensions in the micron range. The same applies for electron beam lithography. In connection with the production of negative molds from these electron beam or X-ray sensitive plastics in the form of columns or pins having a very small base surface, the problem arises that individual columns or pins do not adhere sufficiently to the carrier plate and therefore may be rinsed away by developer fluid.

In a micromolding technique disclosed in German Patent No. 3,206,820, end faces of microstructures of a molding tool and a corresponding surface of a carrier plate must be extremely planar and must be pressed against one another under high pressure to prevent plastic introduced in liquid form from seeping in between these surfaces and interfering with the electroshaping, which likewise leads to losses of structure.

German Published Patent Application 3,335,171.A1 discloses a method of producing microstructures in which, after completion of production of a plastic mold from a positive or original shape, initially a photolacquer film which had previously been applied to a surface of an electrically conductive base plate of a molding tool and which is to undergo an intimate bond with a molded plastic substance during a molding process, remains at the bottom of a plastic negative mold and is removed before electroforming of the positive product. For the removal of the photolacquer film at the bottom of the plastic negative mold, irradiation with UV light and subsequent dissolving away by means of a developer solution are proposed. However, such photolacquer films have no optimum adhesion promoting characteristics, which is why this method has not found acceptance in practice.

SUMMARY OF THE INVENTION

It is an object of the invention to improve methods of this type with respect to production of negative molds so that no losses or errors occur in microstructures during electroshaping.

This and other objects are achieved in a method of producing microstructured metallic bodies including producing plastic negative molds of microstructures on a surface of an electrically conductive base plate, by means of one of electron beam lithography, X-ray lithography and micromolding techniques, and filling cavities of the plastic negative molds with metal by electroplating while employing the electrically conductive base plate as an electrode, and additionally including the steps of: leaving, during the step of producing the plastic negative molds, a residual layer of plastic at the bottom of the cavities of the negative molds on the electrically conductive base plate; and, before the step of filling cavities of the plastic negative molds with metal by electroplating, reactively ion etching the residual layer of the plastic at the bottom of the cavities, by accelerating ions perpendicularly against the surface of the electrically conductive base plate, to remove the residual layer.

In this way, it is accomplished that fine structures of the negative molds, for example, the above-mentioned thin columns or pins, initially remain connected with one another by way of a common bottom. Only reactive ion etching which does not exert any hydraulic or mechanical transverse forces on the structures of the negative molds, exposes the cavities between these structures down to the surface of the metallic base plate. Although this anisotropic dry etching ("flooding"), for example, with oxygen ions that are accelerated toward the base plate, also removes the uppermost layer of the plastic structures, such a loss can be compensated by a corresponding increase in height of the plastic layer to be applied to the base plate before it is irradiated. In any case, the invention avoids losses or errors in structure in the decisive lateral region.

BRIEF DESCRIPTION OF THE DRAWINGS

FIG. 1–4 show various steps of the method according to an embodiment of the invention with:

FIG. 1 being a schematic representation of an electrically conductive base plate 1 onto which a layer sensitive to an electron beam or X-rays is applied;

FIGS. 2a and 2b showing negative molds which result after developing and dissolving out irradiated regions 2a in FIG. 1;

FIG. 3 being a schematic representation showing the negative molds (pins 6) after reactive ion etching with oxygen ions is completed; and FIG. 4 being a schematic representation showing cavities 7 filled with metal 9 after electroplating.

DETAILED DESCRIPTION OF THE PREFERRED EMBODIMENT

Embodiments of the invention will now be described with reference to drawing FIGS. 1 to 4.

FIG. 1 is a schematic representation of an electrically conductive base plate 1 onto which a layer 2 of an electron beam or X-ray sensitive plastic (resist) is applied. Between base plate 1 and layer 2 there is disposed a thin intermediate layer 3 made of a plastic which serves as an adhesion promoter. This layer is not sensitive to electron beams or X-rays. Through a mask 4, layer 2 is exposed to electron beam or X-ray radiation 5 so that alternating irradiated and non-irradiated regions 2a, 2b are created in layer 2. The irradiated regions 2a correspond to the structure of the microstructured metallic body to be produced.

By developing and dissolving out the irradiated regions 2a with a developer fluid, a negative mold composed of high, thin columns or pins 6 is produced on the remaining intermediate layer 3. The adhesive forces of layer keep the columns or pins firmly connected with it and also with base plate 1 (FIG. 2a).

A similar configuration is shown in FIG. 2b. In this example, the columns or pins 6a of the plastic negative mold were produced by means of the above-mentioned micro-molding technique. It was knowingly accepted here that, after the unmolding, a thin residual layer 3a of the plastic remained on base plate 1 as the bottom of cavities 7 between pins 6a.

Residual layer 3a and intermediate layer 3 (FIG. 2a) at the bottom of cavities 7 are removed by reactive ion etching in that oxygen ions 8 from an oxygen plasma are accelerated perpendicularly to the surface 1a of base plate 1 and etch away these bottoms (FIG. 3). Reaction products of plastic and oxygen are gaseous and are therefore able to easily escape from the narrow slit-shaped cavities. Base plate 1 should be made of a material, e.g. chromium-nickel steel, which is not attacked by the oxygen ions 8 in a manner that would interfere with the electroplating process. Since the oxygen ions 8 are accelerated perpendicularly to the surface 1a of base plate 1, there is no removal of material at the lateral walls 6b of columns 6, 6a. However, this anisotropic dry etching with oxygen causes a certain amount of material to be removed at the free end faces 6c of column 6. This, however, can be taken into account by providing a corresponding increase in the layer thickness of the plastic layer 2 to be treated. Since in this type of ion etching no lateral forces are exerted onto the columns 6, 6a of the negative molds, the columns remain firm and form-stable on the surface 1a of base plate 1, even if their cross-sectional and base surfaces are small. Cavities 7 are filled in a known manner with a metal 9 by electroplating while employing base plate 1 as the electrode (FIG. 4). Thereafter, the plastic columns 6, 6a can be removed by means of a solvent in order to expose the microstructured metallic body 1, 9.

It has been found in practice that very thin residual layers at the bottom of the cavities are sufficient to ensure success of the invention. For columns produced by electron beam lithography and having a diameter of 1 $\mu$m and a height of several $\mu$m, it is sufficient, when working without an adhesion promotor, to stop the wet development when a residual layer thickness of 0.1 to 0.2 $\mu$m remains at the bottom between the columns. Additionally, after the reactive oxygen ion etching, the electroplating process starts very easily on the exposed surfaces of the metal base plate.

Also, in the production of negative molds by X-ray deep-etch lithography and the micro-molding technique derived therefrom, the treatment according to the invention makes it possible to reduce the reject rate toward zero. With a structural height of 300 $\mu$m for the negative molds and gap width of 10 $\mu$m for the cavities, the ion etching was able to remove all remainders of resist material out of the gaps. By avoiding the step of fully developing the sensitive layer down to the base plate, the subsequent treatment according to the invention quasi takes over, thereby also avoiding structural errors.

Measurements taken at such a negative mold indicated that the treatment with the oxygen ions did not produce a measurable removal along the side walls of the negative mold. The removal at the exposed surface amounted to about 5 $\mu$m.

We claim:

1. In a method of producing microstructured metallic bodies, including producing plastic negative molds of microstructures on a surface of an electrically conductive base plate by means of one of electron beam lithography, X-ray lithography and micromolding techniques, and filling cavities of the plastic negative molds with metal by electroplating while employing the electrically conductive base plate as an electrode; the improvement comprising the steps of:
   (a) leaving, during said step of producing the plastic negative molds, a residual layer of plastic at the bottom of the cavities of the negative molds on the electrically conductive base plate; and,
   (b) before said step of filling cavities of the plastic negative molds with metal by electroplating, reactively ion etching the residual layer of the plastic at the bottom of the cavities, by accelerating ions perpendicularly against the surface of the electrically conductive base plate, to remove the residual layer.

2. A method according to claim 1, wherein said step of reactively ion etching comprises using an oxygen plasma.

3. A method according to claim 1, wherein said step of producing comprises a step of first applying a plastic adhesion promoter layer to the electrically conductive base plate to serve as the residual layer of plastic.

4. A method of producing microstructured metallic bodies comprising the steps of:
   producing plastic negative molds of microstructures on a surface of an electrically conductive base plate by using one of electron beam lithography, X-ray lithography and micromolding;
   during said step of producing, providing a residual layer of plastic at the bottom of cavities of the plastic negative molds on the electrically conductive base plate;
   reactively ion etching and removing the residual layer of plastic at the bottom of the cavities by accelerating ions perpendicularly against the surface of the electrically conductive base plate; and
   filling the cavities of the plastic negative molds with metal by electroplating using the conductive base plate as an electrode.

5. A method according to claim 4, wherein said electrically conductive bore plate is a chromium-nickel steel base plate.

6. A method according to claim 4, wherein said step of providing a residual layer comprises providing a residual layer having a thickness between 0.1 and 0.2 micrometers.

7. A method according to claim 4, wherein said step of producing includes depositing a layer of radiation sensitive plastic on the surface of the electrically conductive base plate; and
   forming the negative molds in said layer of plastic by one of electron beam lithography and x-ray lithography.

8. A method according to claim 7, wherein said step of producing further includes depositing a thin adhesion promoting layer of a plastic which is not sensitive to electron or x-ray radiation to said surface of said electrically conductive base plate prior to depositing said layer of a radiation sensitive plastic, whereby said thin adhesion promoting layer forms said residual layer.

9. A method according to claim 4, wherein said step of depositing a thin adhesion promoting layer comprises depositing a thin adhesion promoting layer of a plastic having a thickness between 0.1 and 0.2 micrometers.

* * * * *